United States Patent
Lebreton

(10) Patent No.: US 9,562,941 B2
(45) Date of Patent: Feb. 7, 2017

(54) METHOD OF LOCATING AN EVENT TRANSMITTING A SIGNAL

(71) Applicant: ALSTOM Technology Ltd, Baden (CH)

(72) Inventor: Raphaël Lebreton, Massy (FR)

(73) Assignee: ALSTOM TECHNOLOGY LTD, Baden (CH)

( * ) Notice: Subject to any disclaimer, the term of this patent is extended or adjusted under 35 U.S.C. 154(b) by 107 days.

(21) Appl. No.: 14/346,294

(22) PCT Filed: Sep. 19, 2012

(86) PCT No.: PCT/EP2012/068441
§ 371 (c)(1),
(2) Date: Mar. 20, 2014

(87) PCT Pub. No.: WO2013/041566
PCT Pub. Date: Mar. 28, 2013

(65) Prior Publication Data
US 2014/0239969 A1    Aug. 28, 2014

(30) Foreign Application Priority Data

Sep. 20, 2011    (FR) ...................... 11 58365

(51) Int. Cl.
*G01R 31/08*    (2006.01)
*G01S 5/00*    (2006.01)
(Continued)

(52) U.S. Cl.
CPC ........... *G01R 31/08* (2013.01); *G01R 31/1254* (2013.01); *G01S 5/00* (2013.01); *G01S 5/22* (2013.01); *G01R 31/027* (2013.01)

(58) Field of Classification Search
CPC .............. G01R 31/08; H04B 1/59; G01S 3/80
(Continued)

(56) References Cited

U.S. PATENT DOCUMENTS 5,166,694 A    11/1992    Russell et al.
5,703,564 A    12/1997    Begum et al.
(Continued)

FOREIGN PATENT DOCUMENTS

EP    0 955 550 A1    11/1999
EP    1 439 396 A2    7/2004
(Continued)

OTHER PUBLICATIONS

Borghetto, J. et al., "Partial Discharge Inference by an Advanced System. Analysis of Online Measurements Performed on Hydrogenerator", IEEE Transactions on Energy Conversion, IEEE Service Center, Piscataway, NJ, US, vol. 19, Issue 2, Jun. 1, 2004, pp. 333-339.
(Continued)

*Primary Examiner* — Jermele M Hollington
*Assistant Examiner* — Zannatul Ferdous
(74) *Attorney, Agent, or Firm* — Nixon Peabody LLP; Khaled Shami

(57) ABSTRACT

The invention relates to a method and a device for locating an event transmitting a signal, including a set of sensors ($A_i$-$A_m$) to measure the response times of the said signal, and processing means (3) to solve a system of equations defining distances between the said sensors and the said event as a function of a speed of propagation of the said signal and of an offset of the said response times relative to a reference time, where the device also includes:
  processing means (3) to recommence multiple times the solution of the system of equations, each time modifying the response time of at least one of the said sensors according to a local variation, and
  processing means (3) to determine the location of the event as a function of the positions obtained when the different solutions of the system of equations are found.

9 Claims, 6 Drawing Sheets

(51) Int. Cl.
*G01S 5/22* (2006.01)
*G01R 31/12* (2006.01)
*G01R 31/02* (2006.01)

(58) Field of Classification Search
USPC .......................................................... 324/536
See application file for complete search history.

(56) References Cited

U.S. PATENT DOCUMENTS

| | | | |
|---|---|---|---|
| 7,142,757 B1 | 11/2006 | Ward | |
| 7,171,091 B1 | 1/2007 | Ward | |
| 8,755,658 B2 | 6/2014 | Proulx | |
| 2004/0100868 A1* | 5/2004 | Patterson, Jr. | F41H 11/00 367/127 |
| 2006/0050610 A1* | 3/2006 | Harvey | G01S 5/22 367/5 |
| 2008/0199135 A1 | 8/2008 | Proulx | |
| 2009/0119035 A1 | 5/2009 | Younsi et al. | |
| 2009/0201953 A1 | 8/2009 | Peyghambarian et al. | |
| 2010/0195445 A1* | 8/2010 | Calhoun | G01S 5/0205 367/127 |
| 2010/0247046 A1 | 9/2010 | Dong et al. | |
| 2012/0143533 A1 | 6/2012 | Luna et al. | |
| 2013/0090883 A1 | 4/2013 | Louise et al. | |

FOREIGN PATENT DOCUMENTS

| | | | |
|---|---|---|---|
| WO | 2011/051910 A1 | 5/2011 | |
| WO | 2011/157753 A1 | 12/2011 | |
| WO | 2013/041566 A1 | 3/2013 | |
| WO | 2013/131948 A1 | 9/2013 | |

OTHER PUBLICATIONS

Cavallini, A. et al., "A new approach to diagnosis of solid insulation systems based on PO signal inference", IEEE Electrical Insulation Magazine, IEEE Service Center, New York, NY, US, vol. 11, Issue 2, Mar. 1, 2003, pp. 23-30.

Contin, A. et al., "Digital detection and fuzzy classification of partial discharge signals", IEEE Transactions on Dielectrics and Electrical Insulation, vol. 9, Issue 3, Jun. 1, 2002, pp. 335-348.

Montanari, G.C. et al., "A new approach to partial discharge testing of HV cable systems", IEEE Electrical Insulation Magazine, IEEE Service Center, New York, NY, US, vol. 11, Issue 1, Jan. 1, 2006, pp. 14-23.

Moore, P. et al "Radiometric Location of Partial Discharge Sources on Energized High-Voltage Plant", IEEE Transactions on Power Delivery, vol. 20, Issue 3, IEEE, Jul. 1, 2005, pp. 2264-2272.

Portugues, I. et al "RF-Based Partial Discharge Early Warning System for Air-Insulated Substations", IEEE Transactions on Power Delivery, vol. 24, Issue1, IEEE, Jan. 1, 2009, pp. 20-29.

Sahoo, N.C. et al., "Trends in partial discharge pattern classification: a survey", IEEE Transactions on Dielectrics and Electrical Insulation, vol. 12, Issue 2, Apr. 11, 2005, pp. 248-264.

Stewart, B.G. et al "Triangulation and 3D Location Estimation of RFI and Partial Discharge Sources Within a 400kV Substation", Electrical Insulation Conference, 2009, IEEE, Piscataway, NJ, USA, May 1, 2009, pp. 164-168.

Strachan, S.M. et al., "Knowledge-based diagnosis of partial discharges in power transformers", IEEE Transactions on Dielectrics and Electrical Insulation, IEEE Service Center, Piscataway, NJ, US, vol. 15, Issue 1, Feb. 1, 2008, pp. 259-268.

PCT International Search Report and Written Opinion in Application No. PCT/EP2013/054489, mailed on Apr. 5, 2013.

PCT International Preliminary Report on Patentability in Application No. PCT/EP2013/054489, mailed on Mar. 18, 2014.

PCT International Preliminary Report on Patentability in Application No. PCT/EP2012/068441, mailed on Apr. 3, 2014.

PCT International Search Report and Written Opinion in Application No. PCT/EP2011/059947, mailed on Oct. 11, 2011.

PCT International Preliminary Report on Patentability in Application No. PCT/EP2011/059947, mailed on Jan. 3, 2013.

French Search Report in French Patent Application No. FR1252152, mailed on Nov. 29, 2012.

Luo, Ri-cheng et al., "Study on Partial Discharge Localization by Ultrasonic Measuring in Power Transformer Based on Particle Swarm Optimization", 2008 International Conference on High Voltage Engineering and Application, ICHVE 2008, pp. 600-603, Nov. 9-13, 2008.

Tsui, James Bao-Yen, "Basic GPS Concept" Fundamentals of Global Positioning System Receivers: A Software Approach, Chapter Two, pp. 7-31, Jan. 27, 2005.

Win, Su Su et al., "Partial Discharge Detection and Localization in Power Transformers", 8th International Conference on Electrical Engineering/Electronics, Computer, Telecommunications and Information Technology (ECTI-CON), pp. 673-676, May 17-19, 2011.

International Search Report in International Application No. PCT/EP2012/068441, mailed Oct. 23, 2012.

Non-Final Office Action issued on Jun. 29, 2015 in U.S. Appl. No. 14/346,309.

\* cited by examiner

METHOD OF LOCATING AN EVENT TRANSMITTING A SIGNAL

CROSS-REFERENCE TO RELATED PATENT APPLICATION

The present application is a National Stage Application of International Application No. PCT/EP2012/068441 entitled "Method of Locating an Event Transmitting a Signal" filed Sep. 19, 2012, which claims priority to French Patent Application No. 1158365, filed Sep. 20, 2011, the contents of which are incorporated herein by reference in their entirety.

TECHNICAL FIELD

The present invention relates to a method using a set of sensors to locate an event transmitting a signal. The signal may be an acoustic signal, an electromagnetic signal such as a radio signal, or again an electromechanical signal such as vibration from an electromechanical organ of an electrical device. The event to be located may be, for example, a partial discharge in an electrical device, the activation of a vocal source in a space, a pressure transient in a pipeline, or another event.

The present invention may be used, in particular, in methods for detecting and locating faults or sources of partial discharges in an electrical device or closed chamber such as a power transformer or an air blast switch circuit-breaker. Partial discharges in electrical devices are associated with the transmission of an acoustic signal (generally an ultrasonic signal), or an electromagnetic signal.

This application to electrical devices is not restrictive; many other applications could be concerned, for example in the field of sonar, or for locating a voice source in a space, surveillance of pipelines, etc.

STATE OF THE PRIOR ART

The conventional method for locating a source of a signal consists in measuring the response times of the signal by a set of sensors, and solving a system of equations defining the distances between the sensors and the source as a function of the response times measured by the sensors. The solution of the system of equations gives the position of the source of the signal.

If the system of equations has no solution, the conventional method proposes changing the position of the sensors to obtain an improved signal and then repeating the calculations and recommencing the movements and the calculations until a solution to the system of equations is found.

However, cases exist where it would not be possible to move the sensors, particularly in the case of ultra-high-frequency, UHF, sensors. In addition, there are cases in which the source would be difficult to find even by moving the sensors, and in particular with sensors with very short response times or which are insufficiently accurate, or in the case of a search for a transmission in a severe environment with, for example, obstacles which may delay or weaken the signal.

The object of the present invention is consequently to propose a system and a method for locating an event transmitting a signal which does not have the abovementioned disadvantages, and in particular which obviates the need to move the sensors.

DESCRIPTION OF THE INVENTION

The present invention is defined by a method for locating an event transmitting a signal, including a measurement of the response times of the said signal by a set of sensors, and a solution of a system of equations defining distances between the said sensors and the said event as a function of a speed of propagation of the said signal and of an offset of the said response times relative to a reference time. If the system of equations has no solution indicating the position of the event the method includes the following steps:

recommencing several times the solution of the system of equations, by modifying with each iteration the response time of at least one of the said sensors, applying an increase or a reduction of the said response time by a percentage of less than a determined value, where the solution of the said system of equations is recommenced with each iteration, until the sum for each of the sensors, of the different increases or reductions of the said response time by a percentage of less than a determined value, is close to zero, and determining the location of the event by calculating the average of the solutions obtained when finding the solutions of the said system of equations.

This method enables an alternative solution to a location having no points of intersection by a traditional method to be found in a simple manner.

This advantage is, in particular, of great interest if it is not possible to move the sensors, or again if the position of the event is difficult to find even by moving the sensors. This method also enables the area in which the event occurs to be obtained with a minimal number of sensors. The method also enables a very satisfactory approximation of the location of the event to be given. In addition, implementation of the method is facilitated by varying the percentage, for example in a random manner, in order that every a priori solution may be disregarded, and to allow a variation average close to zero.

The said determined value may be of the order of 30% and preferably of 15%.

Increasing or reducing the response time by a percentage of between 0% and 15% enables the location of the event to be determined with great accuracy. In addition, a variation of between 0% and 30% may be made if no result is found, or if the number of converging systems of equations is too small.

Advantageously, the solution of the system of equations is recommenced with each iteration until the sum for each of the sensors, of the different local variations of the response time which have produced solutions, is less than 2% and preferably less than 1%.

Summing local variations of close to zero enables the accuracy of the location of the signal's event to be improved.

If the transmission date of the said signal is unknown the reference time according to a first embodiment corresponds to a minimal response time measured by one of the sensors of the said set of sensors, and if the transmission date of the said signal is known, the reference time according to a second embodiment corresponds to the said transmission date.

The sensors are advantageously positioned according to a frame of reference of two-dimensional or three-dimensional coordinates such that, for at least a determined minimal number of sensors, each sensor has at most a single coordinate in common with a single other sensor.

This enables the accuracy of the solution to be improved.

If the transmission date of the signal is unknown, the set of sensors includes a number of sensors which is strictly greater than the number of coordinates, and if the transmission date of the said signal is known, the set of sensors includes a number of sensors which is greater than or equal to the number of coordinates. In a three-dimensional frame of reference the set of sensors thus includes at least three sensors if the transmission date of the signal is known, and at least four sensors if it is unknown.

The invention also relates to a device for locating an event transmitting a signal, including:

a set of sensors to measure the response times of the said signal, processing means to solve a system of equations defining distances between the said sensors and the said event as a function of a speed of propagation of the said signal and of an offset of the said response times relative to a reference time, processing means to recommence several times the solution of the system of equations, each time modifying the response time of at least one of the said sensors, through an increase or a reduction of the said response time by a percentage of less than a determined value, where the solution of the said system of equations is recommenced with each iteration, until the sum for each of the sensors of the different increases or reductions of the said response time by a percentage of less than a determined value is close to zero, and processing means to determine the location of the event by calculating the average of the solutions obtained when the solutions of the said system of equations are found.

The set of sensors advantageously includes ultra-high-frequency sensors and/or ultrasonic sensors.

The invention also relates to a computer program including code instructions for executing the method of location according to any one of the above characteristics when it is executed by processing means.

BRIEF DESCRIPTION OF THE ILLUSTRATIONS

The present invention will be better understood on reading the description of example embodiments given, purely as an indication and in no sense restrictively, making reference to the appended illustrations in which.

DETAILED DESCRIPTION OF PARTICULAR EMBODIMENTS

The basic principle of the present invention is a modification of the response times of the sensors by local variations around their initial values.

Figure 1:
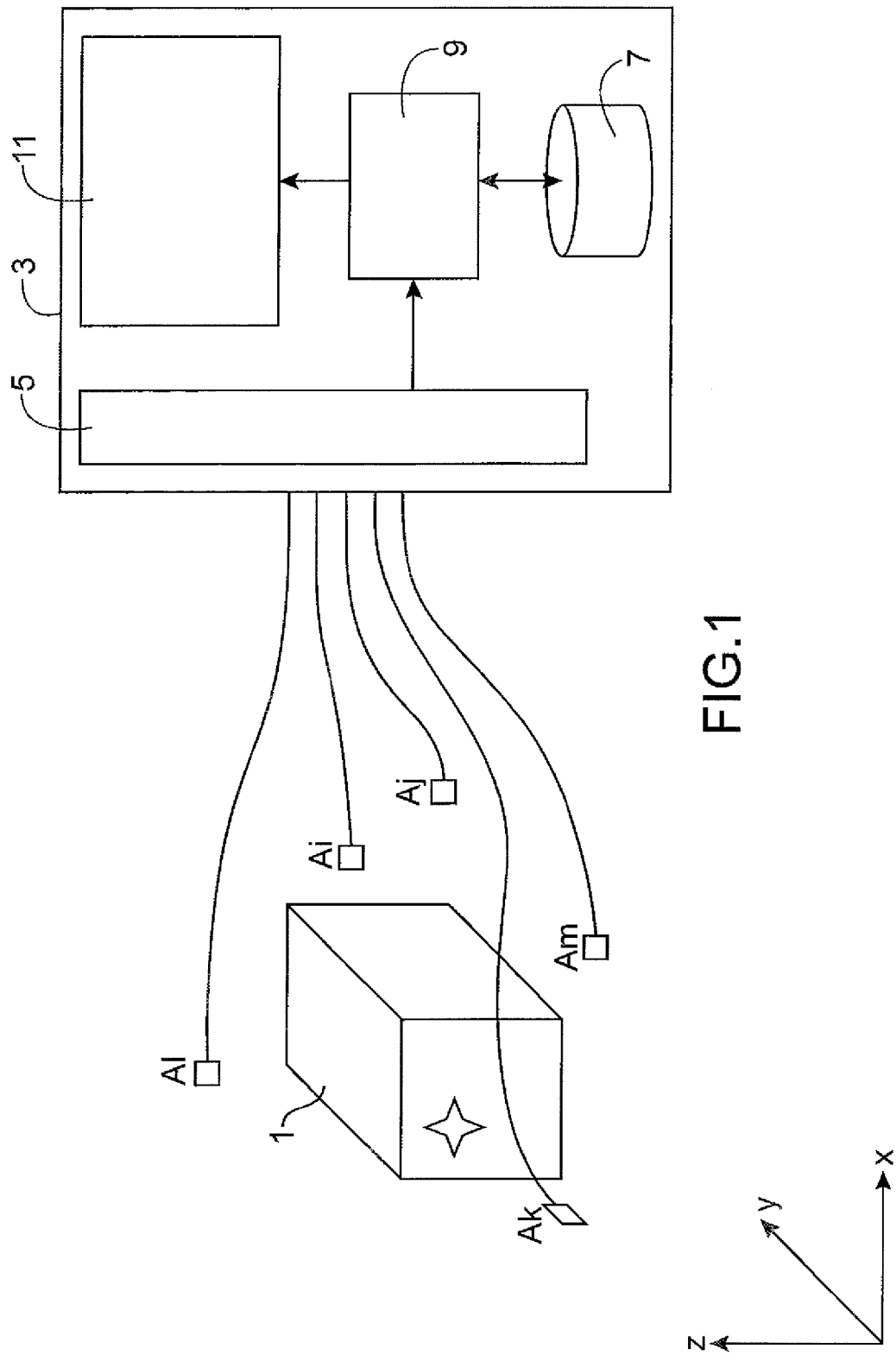
FIG. 1 represents schematically a device for locating an event transmitting a signal originating in an object of some kind which is to be supervised, according to the invention.

FIG. 1 represents schematically a device or system for locating an event transmitting a signal originating in an object of some kind which is to be supervised, according to the invention. The location system includes a set of $A_i$-$A_m$ sensors positioned around object 1 which is to be supervised, and connected to signal processing means 3.

It will be noted that the location device or system according to the invention may be used in a two-dimensional or three-dimensional space. For example, the device may be used to seek to locate the source transmitting a signal on the ground or on a surface, and in this case the sensors are positioned on the surface according to a frame of reference of two-dimensional coordinates. According to another example the system may be used to seek to locate a signal originating in a three-dimensional object and, in this case, the sensors may be positioned around this object in a frame of reference of three-dimensional coordinates.

Advantageously, to increase location accuracy, the $A_i$-$A_m$ sensors are positioned such that, for at least a determined minimal number of sensors, each sensor has at most one single coordinate in common with one single other sensor.

In other words, each sensor has no more than one coordinate in common with each of the other sensors, and no more than two sensors have the same coordinate. The determined minimal number of sensors may be equal to three or four, depending on the dimension of the space, the types of sensors, or the configuration of the location device.

The sensors may be "US" ultrasonic detectors or "UHF" ultra-high-frequency detectors, and are configured to measure response times of a signal transmitted by event S (represented by a small star), the location of which is sought. It will be noted that the response time of a signal means the time of reception of the signal by the sensor.

Processing means 3 include acquisition means 5, storage means 7, computational means 9 and output means 11, including, for example, display means 13. Acquisition means 5 are configured to acquire and digitise the measurements made by the sensors. Computational means 9, in combination with storage means 7, are configured to solve a system of equations defining distances between the $A_i$-$A_m$ sensors and event S according to the speed of propagation of the signal and an offset of the response time relative to a reference time. The reference time may be equal to the transmission date of the signal, or to a response time of another sensor in relation to which the other response times are defined.

It will be noted that storage means 7 may include a computer program including code instructions for the implementation of the method of location according to the invention when the computer program is executed by processing means 3.

In accordance with the invention, if the system of equations has no solution indicating the position of event S, processing means 3 are configured to recommence multiple times the solution of the system of equations, each time modifying the response time of at least one of the sensors according to a local variation. A local variation is understood to mean a relatively small variation in proximity to the initial value of the response time. The sum of the variations is advantageously asymptotically zero.

In addition, processing means 3 are configured to determine by a statistical method the location of event S according to the positions obtained from the different solutions of the system of equations.

Figure 2:
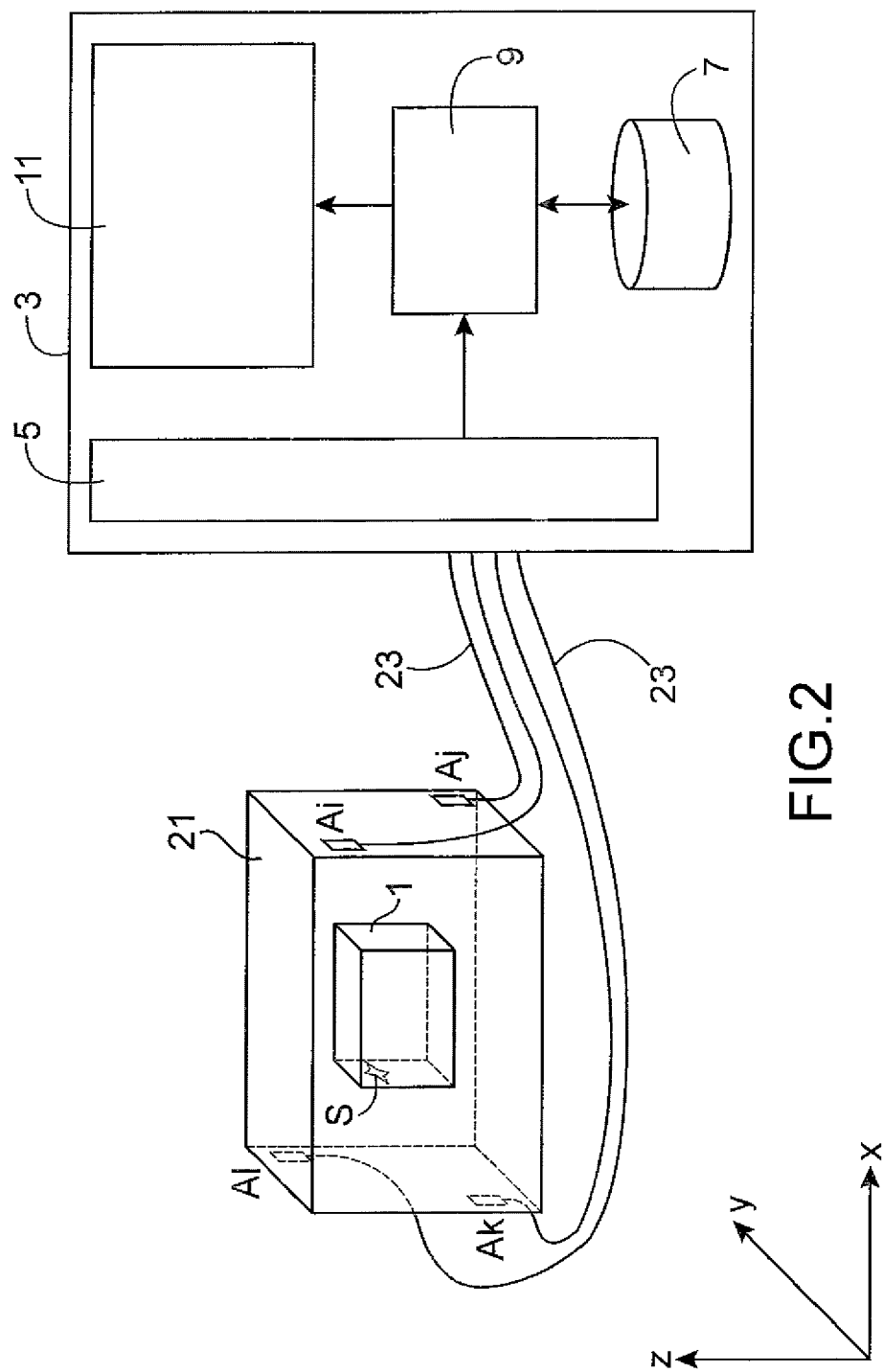
FIG. 2 represents schematically a device for locating a source originating in an electrical device, according to the invention.

FIG. 2 represents schematically a device for locating a source originating in an electrical device, according to the invention.

This electrical device 1 is, for example, a power transformer generally consisting of a chamber or tank 21 containing a dielectric fluid such as oil or sulphur hexafluoride.

A set of sensors $A_i$-$A_l$ is positioned around electrical device 1 to detect the position of a signal corresponding to the occurrence of a sought event S, for example the instant of appearance of a partial discharge originating in electrical device 1.

Ultrasonic, US, sensors or ultra-high-frequency, UHF, sensors may be used. Ultrasonic sensors are piezoelectric sensors which may be installed on tank 21 which comprises electrical device 1. These US sensors positioned on one or more walls of tank 21 perceive the acoustic waves or vibrations produced by the discharges originating from electrical device 1. The response times of the US sensors are of the order of one millisecond.

As a variant, the ultra-high-frequency, UHF, sensors are sensors which detect electromagnetic waves. It will be noted that tank 21 is generally made of steel, and does not allow electromagnetic waves to pass through it. The UHF sensors may thus be inserted in tank 21 via, for example, a valve (not represented) and/or may be installed against a pane (for example made of nylon, Teflon or another non-metallic material) of tank 21. UHF sensors have response times of the order of one nanosecond and may therefore receive signals which are 1,000 times faster than US sensors.

The $A_i$-$A_l$ sensors are advantageously positioned such that they are spaced as far as possible from one another, and such that they do not have two coordinates in common two-by-two.

To facilitate and increase the accuracy of the solution it is thus advantageous, as far as possible, not to position the sensors either at the same height z, nor on the same abscissa x, and nor on the same ordinate y. In particular, in the example of FIG. 2, the four $A_i$-$A_l$ sensors have only two coordinates in common two-by-two. For example sensors $A_i$ and $A_j$ may have the same abscissa, sensors $A_i$ and $A_k$ the same height, sensors $A_j$ and $A_k$ the same ordinate, sensors $A_j$ and $A_l$ the same height, sensors $A_k$ and $A_l$ the same abscissa, and the other coordinates are different. In addition, the sensors are positioned quite close to the edges of the chamber, whilst not having minimal or maximal coordinates, in order to preserve the sensors' satisfactory reception sensitivity. A larger number of sensors, of course, enables the location of the event to be improved. Coordinates $(x_i, y_i, z_i)$, $(x_j, y_j, z_j)$, $(x_k, y_k, z_k)$ and $(x_l, y_l, z_l)$ of the set of sensors may be recorded in storage means 7.

Reference S illustrates a partial discharge source corresponding to the sought event. When this partial discharge appears, therefore, sensors $A_i$, $A_j$, $A_k$, and $A_l$ measure response times $t_i$, $t_j$, $t_k$, and $t_l$ respectively of the signal transmitted by this event. More specifically, the signals acquired by sensors $A_i$-$A_l$ are transmitted via connection wires 23 to processing means 3 which will process these signals to determine and display the response times.

Coordinates $(x_i, y_i, z_i)$, $(x_j, y_j, z_j)$, $(x_k, y_k, z_k)$, $(x_l, y_l, z_l)$ of sensors $A_i$-$A_l$, and their response times $t_i$-$t_l$, together with speed of propagation v of the signal in the medium in question, enable processing means 3 to define a system of equations the solution of which represents the position of event S. The system of equations defines the distances between sensors $A_i$-$A_l$ and event S as a function of speed of propagation v of the signal, and of an offset of the response times relative to a reference time.

Figure 3:
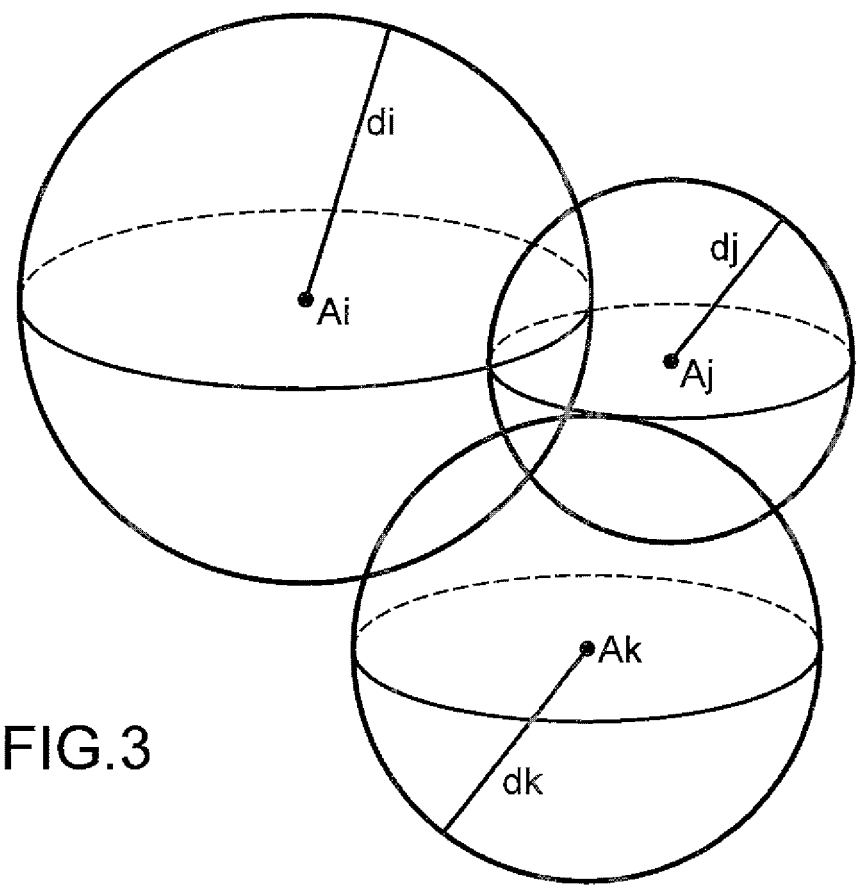
FIG. 3 illustrates the intersection of the spheres representing the solution of a system of equations defining the relationships between the positions of the sensors and the position of the event transmitting a signal.

Indeed, in a three-dimensional space, each equation is that of a sphere, and the solution of the system of equations consists in determining the common point between the different spheres. This is illustrated in FIG. 3 in the context of a location device including three sensors, $A_i$, $A_j$ and $A_k$. Let it be supposed that $t_0$ is the time at which the signal is transmitted, and $t_i$, $t_j$, $t_k$ the response or reception times of sensors $A_i$-$A_k$. For a speed of propagation v of the signal in the surrounding medium, the system of equations of distances $d_i$, $d_j$, and $d_k$ between the sensors and the source of the signal may therefore be defined in the following form:

$$d_i = (t_i - t_0)v$$

$$d_j = (t_j - t_0)v$$

$$d_k = (t_k - t_0)v$$

If the response times and speed of propagation v are known, it is then possible to determine the intersection between spheres (or circles in the case of a two-dimensional space) the centres of which are the positions of sensors $A_i$-$A_k$, and the radii of which distances $d_i$-$d_k$ travelled by the wave during the measured response times.

Figure 4:
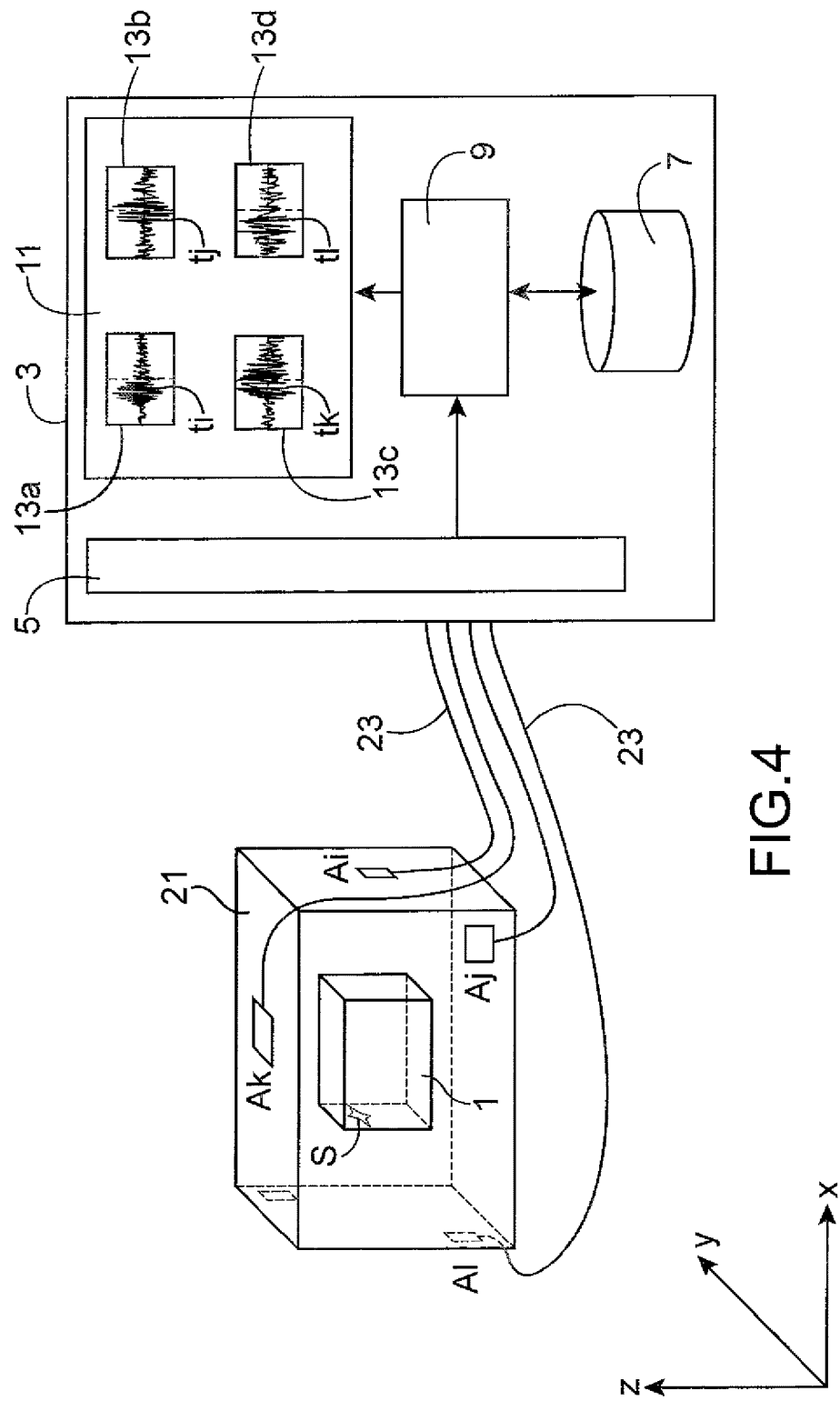
FIG. 4 represents schematically a device for locating a signal, including four sensors to illustrate the case in which the transmission date of the signal is unknown, according to the invention.

FIG. 4 represents schematically a device for locating a signal, including four sensors to illustrate the case in which the transmission date of the signal is unknown.

If the transmission date of the signal is unknown, the reference time is equal to the minimal response time measured by one of the sensors of a set including at least four sensors. In other words, the sensor closest to source S of the signal, the one of which the response time is shortest, becomes the reference sensor.

According to this example, four sensors $A_i$, $A_j$, $A_k$, and $A_l$ are positioned around electrical device 1. These sensors are connected via connecting wires 23 to processing means 3. The signals and response times may be displayed on display means 13a-13d included in output means 11.

Let it be supposed that, of this set of four sensors $A_i$-$A_l$, sensor $A_l$ has the shortest response time and, consequently, the reference sensor in this case corresponds to sensor $A_l$ (i.e. $A_{ref} = A_l$, $x_{ref} = x_l$, $y_{ref} = y_l$, $z_{ref} = z_l$ and $t_{ref} = t_l$). Then, for a source located at a point (x, y, z) which is to be sought, the system of equations has the following form:

$$f_i - f_{ref} - v^2(t_i - t_{ref})^2 = 0$$

$$f_j - f_{ref} - v^2(t_j - t_{ref})^2 = 0$$

$$f_k - f_{ref} - v^2(t_k - t_{ref})^2 = 0$$

where:

$$f_{ref} = (x - x_{ref})^2 - (y - y_{ref})^2 - (z - z_{ref})^2$$

$$f_i = (x - x_i)^2 - (y - y_i)^2 - (z - z_i)^2$$

$$f_j = (x - x_j)^2 - (y - y_j)^2 - (z - z_j)^2$$

$$f_k = (x - x_k)^2 - (y - y_k)^2 - (z - z_k)^2.$$

It will be noted that if UHF sensors are used it is advantageous to use connection wires 23 of the same length, since the speed of propagation of the signal in the wires from the sensors is no longer negligible. This obviates the need to calculate the time caused by the propagation of the signal in these wires 23 since, as a result, it is the same for all four sensors.

Figure 5:
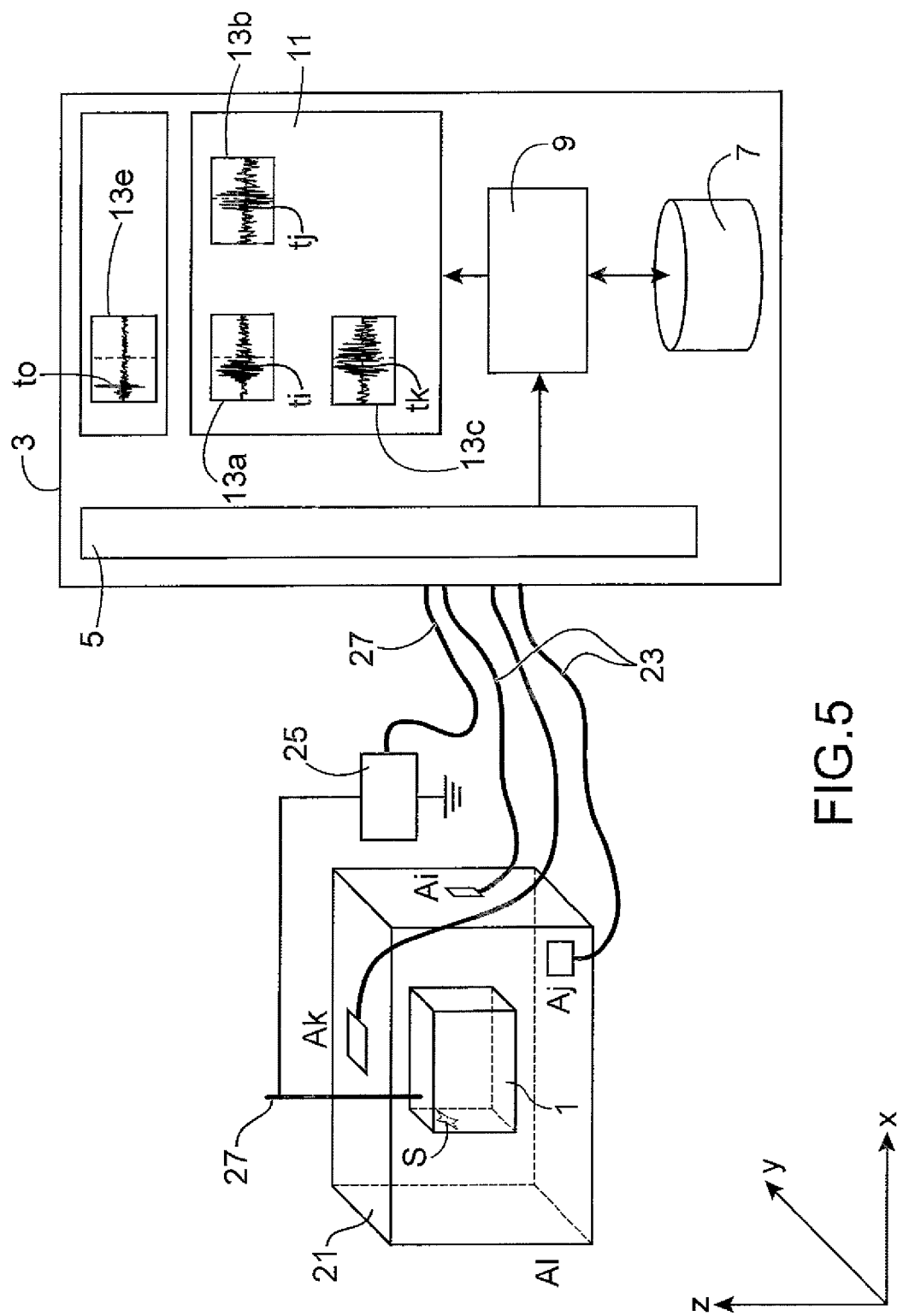
FIG. 5 represents schematically a device for locating a signal, including electrical means to measure the transmission date of the signal, according to the invention.

FIG. 5 represents schematically a device for locating a signal, including electrical means to measure the transmission date of the signal.

If transmission date $t_0$ is known, the reference date is equal to this transmission date $t_0$, and the set of sensors need merely include at least three sensors.

According to this example, three sensors $A_i$, $A_j$, and $A_k$ are positioned around electrical device 1 and are connected via three connection wires 23 to processing means 3. The signals and response times are represented on display means 13a-13c. The location device also includes electrical means including a discharge detector 25.

Discharge detector 25 is connected firstly to a capacitive tap 27 of electrical device 1, and secondly to processing means 3 via a test cable 27. Electrical measurement via capacitive tap 27 enables processing means 3 to determine transmission date $t_0$ of the signal which is represented on display means 13e.

It will be noted that the propagation time of the electrical signal in test cable 27 is unknown, and is no longer negligible compared to the response time of sensors $A_i$-$A_k$. In this case, therefore, only sensors of the US type, which do not have relatively high response speeds, can be used.

If the set of sensors includes only three sensors $A_i$, $A_j$, $A_k$, the corresponding system of equations is thus defined as follows:

$$(x-x_i)^2+(y-y_i)^2+(z-z_i)^2-v^2(t_i-t_0)^2=0$$

$$(x-x_j)^2+(y-y_j)^2+(z-z_j)^2-v^2(t_j-t_0)^2=0$$

$$(x-x_k)^2+(y-y_k)^2+(z-z_k)^2-v^2(t_k-t_0)^2=0$$

It happens that, for various reasons, there is no solution to the system of equations or, in other words, that the spheres defined by these equations have no common point. For example, timing which is inaccurate due to the user's lack of knowledge, a noisy signal, insufficient sampling of the signal, injudicious approximation by the user, or many other faults, may compromise the intersection of the spheres (or that of the circles in the case of a two-dimensional space) the equality of which it is sought to solve.

However, despite there being no solution to the system of equations, the present invention allows a solution to be found, in a two-dimensional or three-dimensional space, by modifying several times the response times of the sensors, and, each time, by recommencing the solution of the system of equations.

If the system of equations, in a two-dimensional or three-dimensional space, where the transmission date of the signal which is known or unknown, has no solution, processing means 3 thus recommence multiple times the solution of the system of equations, each time modifying the response time of at least one of sensors $A_i$-$A_l$ by a local variation.

More specifically, when one of these systems of equations is found and it has no solution, the processing means then modify the response time of at least one of the sensors by a local variation corresponding to an increase or reduction of the response time by a percentage of less than a determined value n %, which may be of the order of 30%, and is preferably of the order of 15%.

In practice, this may be accomplished by adding a new "delta $\Delta$" parameter to the part of the time offset (i.e. the offset of the response time relative to the reference time) for the sensor. This delta $\Delta$ is calculated as a function of the value of the corresponding response time so that the values remain within the same order of magnitude.

The system of equations is then recalculated multiple times, including this new parameter, using a different delta $\Delta$ each time. It may advantageously be required that the sum of these deltas is zero or close to zero for each of the sensors. These deltas may be calculated by using a variable n which will be changed at each iteration p (i.e. with each calculation of the system of equations). Variable n may preferably vary between 0 and 15, but may be higher if no result is found with these values, or if the number of convergent systems of equations is too small.

In order to obtain the value of the deltas as a percentage of the initial values of the sensors' response times, it is, for example, possible to calculate the deltas at iteration p as follows:

$$\Delta_{ip}=\pm(nt_i)/100$$

$$\Delta_{jp}=\pm(nt_j)/100$$

$$\Delta_{kp}=\pm(nt_k)/100$$

$$\Delta_{lp}=\pm(nt_l)/100$$

In order to disregard every a priori solution, and to allow a variation average close to zero, the deltas may advantageously be calculated using a random method.

For three sensors $A_i$-$A_k$, where the transmission date of the signal is known, the system of equations at iteration p thus becomes:

$$(x-x_i)^2+(y-y_i)^2+(z-z_i)^2-v^2(t_i-t_0+\Delta_{ip})^2=0$$

$$(x-x_j)^2+(y-y_j)^2+(z-z_j)^2-v^2(t_j-t_0+\Delta_{jp})^2=0$$

$$(x-x_k)^2+(y-y_k)^2+(z-z_k)^2-v^2(t_k-t_0+\Delta_{kp})^2=0$$

Conversely, with four sensors $A_i$-$A_l$, where the transmission date of the signal is unknown, the system of equations at iteration p becomes:

$$f_i-f_{ref}-v^2(t_i-t_{ref}+\Delta_{ip})^2=0$$

$$f_j-f_{ref}-v^2(t_j-t_{ref}+\Delta_{jp})^2=0$$

$$f_k-f_{ref}-v^2(t_k-t_{ref}+\Delta_{kp})^2=0$$

The solution of the system of equations is advantageously recommenced with each iteration p until the sum for each of the sensors, of the different local variations of the response time which have produced solutions, is less than 2%, and preferably less than 1%, of the initial response time.

In other words, at each iteration the system of equations is calculated, and when a solution is found at an iteration q the values of deltas $\Delta_{iq}$ $\Delta_{jq}$ $\Delta_{kq}$ used in this iteration q are recorded or stored in storage means 7. The sum of these deltas which have produced solutions is calculated, and the process is stopped when this sum is zero or close to zero:

$$\Sigma_q\Delta_{iq}=0 \text{ or } \Sigma_q\Delta_{iq}\leq r_i$$

$$\Sigma_q\Delta_{jq}=0 \text{ or } \Sigma_q\Delta_{jq}\leq r_j$$

$$\Sigma_q\Delta_{kq}=0 \text{ or } \Sigma_q\Delta_{kq}\leq r_k$$

where $r_i$, $r_j$ and $r_k$ are close to zero; the closer these indices are to zero the more reliable the result will be.

Figure 6:
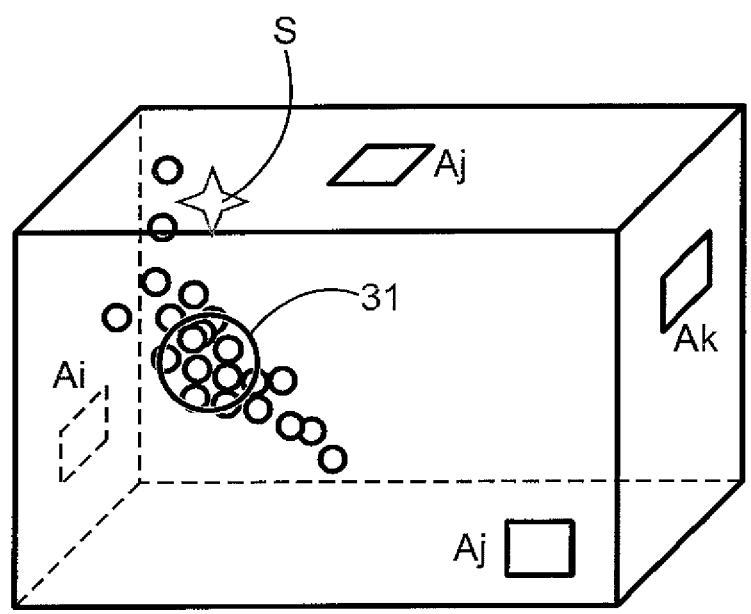
FIG. 6 illustrates results found when solving the system of equations according to the present invention.

Indeed, the FIG. 6 illustrates the case in which the sum of the values of deltas $\Delta_{iq}$ $\Delta_{jq}$ $\Delta_{kq}$ used is close to zero. In this case, the results found (represented by small circles) are grouped together, and the centre of these results is located in a zone close to the real position of source S of the signal.

Furthermore, let it be supposed that the total number of iterations accomplished is P, and that the number of solutions obtained is Q; then ratio Q/P gives an indication of the accuracy of the results found. For example, if Q/P is higher than 70% the result will then be very accurate. Conversely, if Q/P is less than 30% the result will then be very dispersed and, in this case, it is preferable to repeat the entire calculation with new delta values until Q (i.e. the number of solved systems of equations) is, for example, greater than 50.

The results or positions ($x_q$, $y_q$, $z_q$) obtained after Q solutions of the system of equations are recorded in the storage means and are used by the processing means to determine the location of the source of the signal.

The position of the source of the signals will in particular be close to the centre ($x_c$, $y_c$, $z_c$) of these points. Thus, after the solution iterations of the system of equations are stopped (i.e. after the accuracy criteria described above are satisfactory), processing means 3 calculate the location ($x_c$, $y_c$, $z_c$) of the event by averaging the positions ($x_q$, $y_q$, $z_q$) obtained with the different solutions of the system of equations:

$$x_c = \frac{\Sigma_q x_q}{Q}$$
$$y_c = \frac{\Sigma_q y_q}{Q}$$
$$z_c = \frac{\Sigma_q z_q}{Q}$$

The present invention thus enables an alternative solution to a location having no points of intersection by the traditional method to be found. This advantage is, in particular, of great interest if it is not possible to move the sensors, or again if the source is difficult to find even by moving the sensors.

The method according to the invention may be used as another approach to a location which has failed, and which is not incompatible with the first. This method does not therefore cause any loss of time when there is a first successful location; on the contrary, it allows an approximation of the result to be obtained before being obliged, if applicable, to change the place of the sensors in "blind" fashion, if no result had been found.

Another noteworthy advantage may be seen when using only four sensors, which is frequently the case given the technological complexity of the devices to which this technique may be applied. In this manner, only a single intersection point is possible, and therefore the chances of obtaining a solution to the system of equations is very small in light of the accuracy required in this case to measure the sensors' response times. The method according to the invention then nevertheless enables an approximate zone to be obtained in which the source of the transmissions is located.

Further advantages of the present invention are the solution's ease of implementation and simplicity.

The invention claimed is:

1. A method for locating an event transmitting a signal, including a measurement of the response times of the said signal by a set of sensors ($A_i$-$A_m$), and a solution of a system of equations defining distances between the said sensors and the said event (S) as a function of a speed of propagation of the said signal and of an offset of the said response times relative to a reference time, characterised in that if the system of equations has no solution indicating the position of the event the method includes the following steps:

recommencing several times the solution of the system of equations, by modifying with each iteration the response time of at least one of the said sensors, applying an increase or a reduction of the said response time by a percentage of less than a determined value, where the solution of the said system of equations is recommenced with each iteration, until the sum for each of the sensors ($A_i$-$A_m$), of the different increases or reductions of the said response time by a percentage of less than a determined value, is close to zero, and determining the location of the event by calculating the average of the solutions obtained when finding the solutions of the said system of equations.

2. A method according to claim 1, in which the said determined value is of the order of 30%, and preferably of 15%.

3. A method according to claim 1, in which the solution of the system of equations is recommenced with each iteration until the sum for each of the sensors ($A_i$-$A_m$), of the different local variations of the response time which have produced solutions, is less than 2% and preferably less than 1%.

4. A method according to claim 1, characterised in that, if the transmission date of the said signal is unknown, the reference time is equal to a minimal response time measured by one of the sensors of the said set of sensors, and in that, if the transmission date of the said signal is known, the reference time is equal to the said transmission date.

5. A method according to claim 1, characterised in that the sensors ($A_i$-$A_m$) are positioned according to a frame of reference of two-dimensional or three-dimensional coordinates such that, for at least a determined minimal number of sensors, each sensor has at most a single coordinate in common with a single other sensor.

6. A method according to claim 5, characterised in that, if the transmission date of the signal is unknown, the set of sensors includes a number of sensors which is strictly greater than the number of coordinates, and in that, if the transmission date of the said signal is known, the set of sensors includes a number of sensors which is greater than or equal to the number of coordinates.

7. A device for locating an event transmitting a signal, including a set of sensors ($A_i$-$A_m$) to measure the response times of the said signal, and processing means to solve a system of equations defining distances between the said sensors and the said event as a function of a speed of propagation of the said signal and of an offset of the said response times relative to a reference time, characterised in that the device also includes:

processing means to recommence several times the solution of the system of equations, each time modifying the response time of at least one of the said sensors, through an increase or a reduction of the said response time by a percentage of less than a determined value, where the solution of the said system of equations is recommenced with each iteration, until the sum for each of the sensors ($A_i$-$A_m$) of the different increases or reductions of the said response time by a percentage of less than a determined value is close to zero, and processing means to determine the location of the event by calculating the average of the solutions obtained when the solutions of the said system of equations are found.

8. A device according to claim 7, characterised in that the set of sensors includes ultra-high-frequency sensors and/or ultrasonic sensors.

9. A computer program including code instructions for implementing the location method according to claim 1 when it is executed by processing means.

* * * * *